United States Patent [19]

Ouellette

[11] B 3,995,252

[45] Nov. 30, 1976

[54] DATA PROCESSING ARRANGEMENT FOR PRINTERS

[75] Inventor: Maurice J. Ouellette, Waynesboro, Va.

[73] Assignee: General Electric Company, Waynesboro, Va.

[22] Filed: Dec. 26, 1973

[21] Appl. No.: 428,408

[44] Published under the second Trial Voluntary Protest Program on March 2, 1976 as document No. B 428,408.

Related U.S. Application Data

[62] Division of Ser. No. 428,366, Dec. 26, 1973.

[52] U.S. Cl. ............... 340/146.1 AB; 340/365 E
[51] Int. Cl.[2] .............. G06F 3/02; G06F 11/00; G08B 29/00
[58] Field of Search ............. 340/146.1 AB, 147 R, 340/147 LP, 172.5, 365 E; 235/145 R, 146

[56] References Cited
UNITED STATES PATENTS

| | | |
|---|---|---|
| 3,493,928 | 2/1970 | Juliusburger ............. 340/146.1 AB |
| 3,675,239 | 7/1972 | Ackerman et al. ............. 340/365 E |
| 3,683,370 | 8/1972 | Nagano et al. ............. 340/365 E |
| 3,716,850 | 2/1973 | Fisher et al. ............. 340/365 E |
| 3,717,871 | 2/1973 | Hatano et al. ............. 340/365 E |
| 3,740,745 | 6/1973 | Chao ............. 340/365 E |
| 3,750,160 | 7/1973 | Elzinga ............. 340/365 E |
| 3,792,466 | 2/1974 | Arnold et al. ............. 340/365 E |

*Primary Examiner*—R. Stephen Dildine, Jr.
*Attorney, Agent, or Firm*—Michael Masnik

[57] ABSTRACT

Achieving N-key rollover by detecting the leading edge of the binary coded signal generated in bit parallel form in response to keyboard key depression and blocking the receipt of data representing a subsequently depressed key where the width of each binary bit signal is less than the interval between two successive system timing pulses which in turn is much less than the 10 millisecond or so interval between successive key operations by an operator as a result of rollover typing.

19 Claims, 5 Drawing Figures

FIG.1.

DATA PROCESSING ARRANGEMENT FOR PRINTERS

BACKGROUND OF THE INVENTION

This is a division of Serial No. 428,366 filed Dec. 26, 1973.

This invention is related to electronic printers and particularly to methods and means for preparing and processing a plurality of data concurrently originated by a keyboard prior to application to the printer to control printing of desired characters.

In the field of printers, characters are printed in response to input data available from a source such as a keyboard. The data is generally available in the form of binary coded digital signals representative of characters to be printed or control functions to be executed. The control functions are related to proper printing operation and include such functions as line feed, carriage return, etc. In normal or usual operations, no problems are encountered because each character of data is available separately for utilization by the printer. However, problems arise when more than one character appears as in the case involving keyboard data origination when the keyboard operator depresses more than one key at a time. The problem is complicated by the fact that since the individual bits associated with a particular character are of finite duration, the overlap of bits corresponding to different characters can lead to the printing of incorrect characters or to the loss of characters in the printout.

Various schemes have been attempted to resolve these problems. For example, with the design of keyboards for use with teleprinters, it is often desirable to provide a function referred to as "N-key rollover". This function refers to the ability to properly process, that is accept, a sequence of characters in the order in which they are generated upon depression of keys, without regard to whether or not previously depressed keys have been released. One approach for implementing this function is to include in the keyboard electronics a memory which stores separate indications for all concurrently depressed keys. The contents of this memory can then be used to inhibit the output associated with this key after it has once been generated. This approach, however, is costly in that a large memory is required. An alternative approach is to use keys which output a temporary signal or pulse only when first depressed and to also generate a strobing or sampling signal to be utilized during the period of the pulse. This approach has been found to be complex and costly. The problems become complicated when it is desirable to synchronize keyboard signals which may change at any instant of time to a system wherein all signals may change only at discrete time intervals such as in a dynamic logic arrangement. Further difficulties arise when transferring a group of related bits of information from one part of a circuit to another. The transfer may be parallel, each data bit being presented simultaneously on separate lines. It may be serial in which all bits are presented on the same line one at a time. If more than one data source is active on the data line at one time, a merging of data may result, thereby destroying that data.

Accordingly, it is one object of this invention to provide an improved arrangement for achieving N-key rollover simply and efficiently without sacrificing circuit performance.

A further object of this invention is to provide an improved processing arrangement for use with digital data.

Another object of the invention is to resolve ambiguities or problems associated with improper operation of keys in an electronic keyboard by resorting to improved logic circuitry.

Another object of the present invention is to provide an improved multiple switch control arrangement.

The aforementioned general objects and various features of the present invention will become more clearly appreciated from the following description of a particular illustrative embodiment which is made in conjunction with the accompanying drawings wherein:

In accordance with one aspect of the invention N-key rollover is achieved by detecting the leading edge of the signal generated by the initial depression of the key which indicates that the particular key has been depressed, then blinding the input to the keyboard logic for a sufficiently long time to guarantee that the input pulse will be gone. This provides that the same key will not be accepted more than once for each depression.

Figure 1:
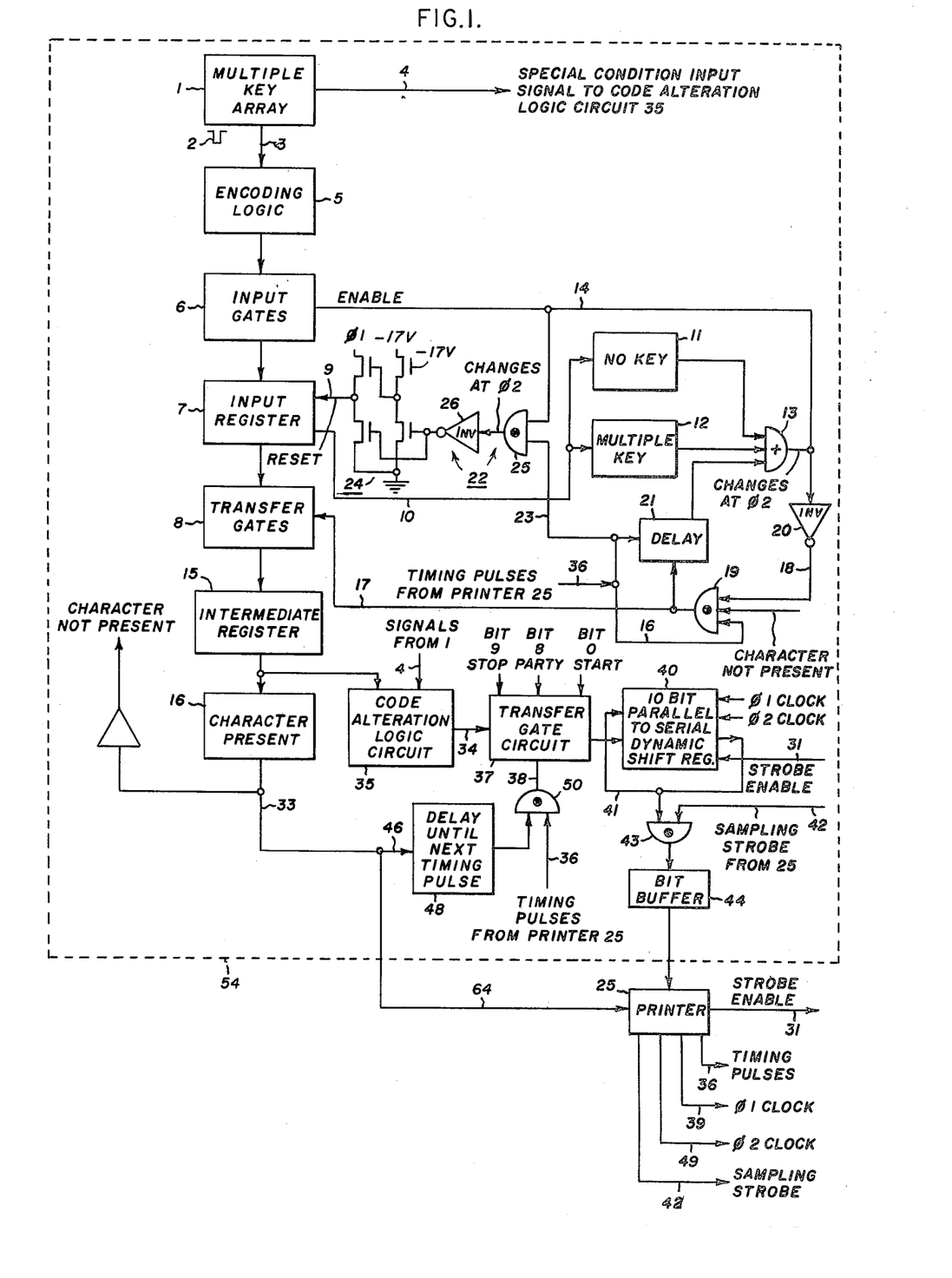
FIG. 1 shows in block diagram form one embodiment of the present invention.

Before turning to a detailed description of the preferred embodiment illustrated in FIG. 1, it will be necessary to set forth a few preliminary remarks concerning digital logic systems. In such systems there are two distinct signal levels. One of these signal levels will be referred to hereinafter as logic 1 and may be represented by a relatively low voltage such as −5 volts. The other logic level will be referred to as a logic 0 and will be represented by a higher voltage such as 0 volts. Throughout the specification reference will be made to a lead. This is intended to mean either a single or plurality of connections or couplings depending upon whether a signal involves a single or a plurality of signal components. An example of the latter is data in bit parallel format. In the embodiment illustrated in the drawings there are shown a number of common logic elements whose operation will be described briefly. A logic element denoted with reference numeral 19 is a simple AND gate. AND gate 19 may have any number of inputs (designated by the arrows). The operation of AND gate is such that its output will go to logic 1 if, and only if, all the inputs are at logic 1. Under all other input conditions, the output of AND gate will be logic 0. The logic symbol denoted by reference numeral 20 is a simple inverter. As is well known, inverter 20 operates such that its output (denoted by the circle) will be a logic 1 when its input (denoted by the arrow) is a logic 0 and vice versa. The logic element denoted with reference numeral 13 is a simple OR gate. OR gate 13 operates such that its output will be a logic 1 if any one or more of its inputs are logic 1. Since the synchronizing of keyboard generated data is to be described with respect to a dynamic logic system, it may be well to point out the features of this system. In a particular embodiment, reference will be made to a two phase dynamic system of clocking for controlling the operation of the printer. In such an arrangement all logic signals are only permitted to change state at the leading edge of the phase two clock signal. One embodiment shown, by way of example, in FIG. 2a utilized phase 2 clock pulses in the form of a square wave of 10 microseconds duration with a negative going 6.25 microseconds pulse duration. Phase 1 clock pulses are permitted to occur only during the positive going portion of phase 2 clock pulses and are utilized to provide desired delays in signals which normally change at phase 2. The phase 1 negative going pulses in such embodiment, FIG. 2b, are of 1.25 microsecond duration. In addition to these clock pulses, system timing pulses, as represented by a 100 microsecond square wave with a 10 microsecond negative going portion, FIG. 2c, are employed. These are utilized to synchronize the various parts of the system. The usefulness of these various pulses will be described shortly.

It may be desirable to briefly review the general function of the circuit of FIG. 1 to facilitate later, more detailed explanation. Keyboard 1 outputs a brief pulse on a pair of leads in response to the depressing of a key representing the letter A, which is independent of the duration that the key remains depressed. Lead 3 actually represents a plurality of leads in two groups wherein each key addresses a unique pair of leads, one from each group. When applied to circuit 5, the pulse pairs result in a 7 bit binary signal representing the character A being applied through normally open gates 6 to the input register 7. Gates 8 are normally closed. This 7 bit signal in 7 is evaluated by blocks 11 and 12 to determine whether it is a valid or invalid signal. An invalid signal is one which is determined to represent a no key depression or a multiple key depression. If the character is invalid, 11 and 12 operate to continue an enable signal as shown in FIG. 5e to gates 6 in order for register 7 to receive the next character. If a first data is found to be valid, gates 6 are disabled or blocked, and 7 remains uncleared. Upon the occurrence of the first system timing pulse following the last key operation, gates 8 are opened for the duration of one system timing pulse, and the first data transferred from 7 to 15, provided the second register 15 is empty of data. If 15 is not empty, the transfer is delayed until 15 is empty. At the occurrence of the second system timing pulse following key operation, register 7 is reset or cleared of stored first data, gates 6 opened and 7 made available to receive new data. Gates 37 are normally closed blocking data from being processed and applied from 15 and 35 to printer 25 to effect printer operation in accordance with the data. When block 16 signals that register 15 has the first data stored therein, gates 37 are opened to apply the first data stored in 15 to the circulating shift register 40. In 40, the first data now equipped with start, stop and parity bits is circulated in bit serial form and and applied to printer 25 in bit serial form at desired times established by sampling strobe signals available on lead 42 from printer 25. When the printer accepts the last bit associated with the data circulating in 40, the first data in 40 is erased by a strobe enable signal developed by 25. The gates 37 were opened only long enough to enable the data in 15 to be applied to 40 and then closed. Register 40 must wait therefore until the second data appears in 15, is sensed by 16 and gates 37 opened to transfer the second data to 40 and then on to the printer.

Referring to FIG. 1 there is shown a multiple key array or keyboard 1 which produces a negative going pulse 2 on its output lead 3 in response to the depression of a key associated with a printable character. In one particular embodiment, the keyboard is operated using well known Hall-effect principles to produce a short duration pulse only in response to the depressing of a key such that duration of the pulse is independent of the duration of the pressing of the particular key. The Hall-effect switch is operated by an electromagnet or a permanent magnet which when operated by a key strobe causes a voltage to be developed across the edges of a thin electrical conductor. The voltage is produced when the magnetic field is created perpendicular to the conductor. The voltage signal is processed to pass only the leading edge by means of well known circuitry, such as for example, a leading edge differenting circuit. In one particular embodiment, depressing a printable character key caused it to output a 10 microsecond to 100 microsecond pulse. The significant factor is that the pulse width is small compared to the typing rate of an operator during rollover typing (of the order of 10 milliseconds). This makes the pulse at its largest only 1% of the rollover typing rate. The variation in pulse width is attributable to the nature of the signal producing circuit used with the Hall-effect element. Further details of the rollover problem and how it is solved will be described shortly.

Array 1 also produces a special condition input signal at logic level 1 for the duration of the depression of any key. These signals on lead 4 are generated in response to operation of a key representing a code alteration, such as a control function, lower or upper case printing, repeat, etc., and will be described in greater detail shortly.

The output pulses on lead 3 are encoded in the encoding logic circuit 5 into unique 7 bit binary signals representative of the printable characters associated with the keys depressed. Gates 6 are normally open to pass the encoded signals available from 5 to the input register 7 for storage therein in binary digital form. Input register 7 is a well known circuit involving essentially a set of static latches which assume a state corresponding to the applied digital signals. The result is that the depression of a printable character key in 1 causes a digital signal representative of this character to be stored in the register 7 and appear at its output without substantially any delay.

Transfer gates 8 are normally blocked and the digital data stored in 7 remains there until a reset signal at logic level 1 is applied to lead 9. The signals stored in input register 7 are examined or sensed on leads 10 in order to determine whether or not the stored information designates a valid character. If the equipment is functioning properly, the cause of an invalid character will be a multiple key or no key condition, that is, a plurality of keys operating in an overlapping time sequence, or a no operated key condition. Detection circuits 12 and 11 are connected to register 7 and evaluate the stored data to determine whether or not there is a multiple key condition or a no operated key condition respectively. These circuits comprise well known comparator circuits as, for example, shown in greater detail in FIG. 6 of co-pending application Ser. No. 421,981 entitled "Method and Apparatus for Controlling Circuitry With a Plurality of Switching Means", filed Dec. 5, 1973 (continuation of Ser. No. 136,853 filed Apr. 23, 1971, now abandoned), in the name of David N. Sitter. If either condition is detected, the data in the register 7 is not processed because it is not a valid input. Since we are seeking valid data, OR gate 13 insures the production of an enable or logic 1 signal to the input gate 6 (see FIG. 5e) over lead 14 when these invalid code conditions appear in order to enable the next data to be applied to input register 7 for evaluation. If the data received from the keyboard is found to be valid, then the data is transferred through gates 8 to the intermediate register 15 as follows. At the occurrence of the next timing pulse following the storing of the data in register 7, transfer gates 8 are unblocked in response to an enable signal developed upon lead 17 provided a valid code signal is indicated on lead 18. Thus, when AND gate 19 gets a logic level 1 signal on lead 16 indicating the occurrence of a timing pulse and a logic level 1 signal on lead 18 indicating a valid code, then a logic 1 signal is developed on 17 to open gates 8 to transfer the data stored in register 7 to the intermediate register 15 (see FIG. 5h). Thereafter, input register 7 is to be reset, that is cleared of stored signals, and the input gates 6 opened (enabled) to admit the next character coming from the source 1. This is achieved by applying the output pulse available from 19 to circuit 21 which introduces a one system clock time delay (from X to Y) at the timing pulse rate as shown in graph (a) of FIG. 5. The timing pulse available from 21 is applied to OR gate 13 to produce a logic level 1 signal on the reset lead 9 after passage through 25 to cause the input register to be reset, that is cleared of its data, and a logic level 1 signal on enable lead 14 to cause the input gates to be enabled to receive the next character code.

The circuitry described so far is useful in overcoming the problem of rollover typing. The solution to this problem involves the ability to properly process (accept) a sequence of characters in the order in which keys are depressed, without regard to whether or not previously depressed keys have been released. One approach for implementing this function is to include in the keyboard electronics a memory which stores separate indications for all concurrently depressed keys. The contents of this memory can then be used to inhibit the output associated with this key after it has once been generated. An alternative approach is to use keys which output a temporary signal (pulse) only when first depressed along with generating a strobing signal during the pulse. These methods are costly or complex.

In the present invention the solution to the rollover problem. commonly referred to a N-key rollover, is, generally speaking, achieved in the following manner. Depressing a key in 1 causes it to output a short (10 microsecond to 100 microsecond) pulse as shown in FIG. 5b. This pulse is encoded into the appropriate code by 5 and this code stored in the input register 7. The input gates 6 are then disabled because of the absence of a no key or a multiple key condition. When the first timing pulse X on 36 occurs, the character will be entered into the intermediate register 15 (see FIG. 5h). The second timing pulse Y will cause the input to be enabled once again at 6. The second timing pulse also causes the data to be transferred to the shift register 40. The input is enabled to accept a second valid character at any time after the second timing pulse subsequent to the initial depression of the first key, whether or not the first key has been released. The time during which the input is inhibited after a character has been accepted must be at least as long as the longest possible duration of the pulse, in order that the same pulse not be accepted twice. It must also be small relative to the time between successive characters in a high rate burst of several characters in succession. Where the output rate is limited to a predetermined maximum, storage must be provided for accepting bursts of characters which may occur at a higher rate than that of the output.

Figure 2:
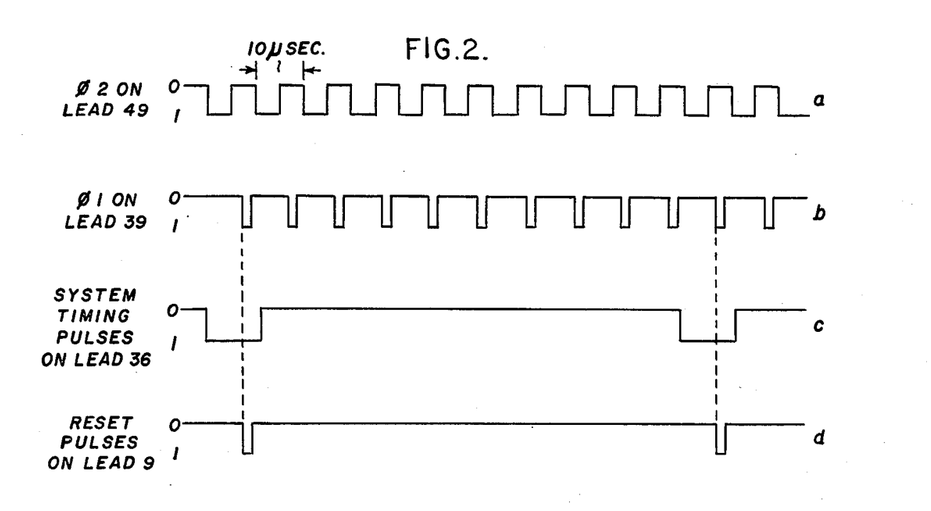
FIGS. 2 through 5 present wave forms useful in explaining the operation of the present invention.

In the printer 25 the above timing is generated from a free-running series of pulses of 10 microsecond duration occurring once each 100 microseconds. Smaller increments of time can be achieved by use of the phase 1 and phase 2 clocks used in the dynamic logic. The duration of phase 1 is 1.25 microsecond; the duration of phase 2 is 6.25 microseconds. For a no character or double character input, the input register is reset during the phase 1 portion of the timing pulse. Their time relationship is shown in FIG. 2. The input is disabled during this 10 microsecond timing pulse only, such that a pulse of any duration greater than 10 microseconds will be detected. This scheme enables the input to be disabled for a minimum amount of time during the reset.

Figure 5:
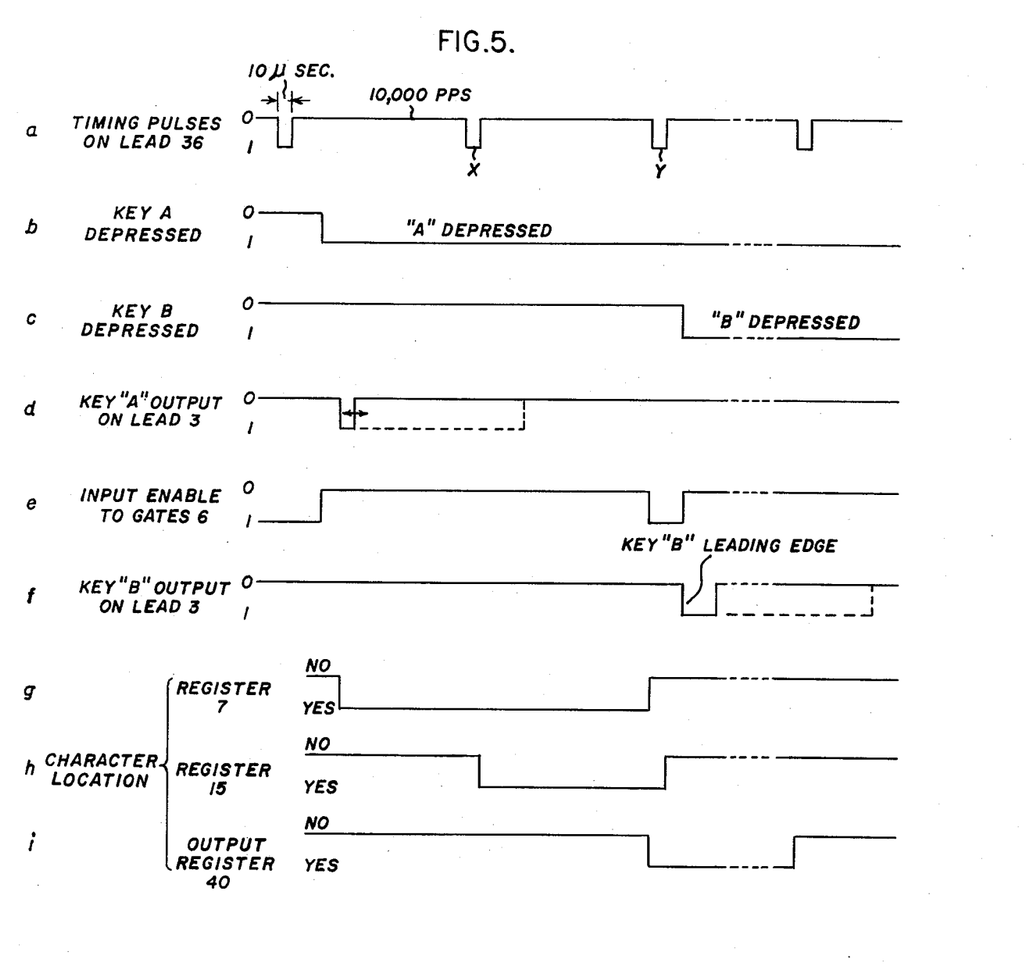

Synchronizing the data input to the phase 1 and phase 2 clocks is accomplished in the following manner. The data input be stored as soon as it is detected, without regard to the clocks. This is accomplished in the input register 7. This data is not allowed to be entered during the system timing pulses. The first timing pulse after the data has been entered into register 7 will transfer this data into register 15 at a clock synchronized time. This transfer timing is depicted in FIG. 5. Whereas, the intermediate register 15 is a set of static latches, this transfer must take place without any undesired glitches which could inadvertently set these latches. This condition is avoided by the transfer timing. This timing is such that the data loading signal will occur only after the data has had a minimum of one dynamic clock time to settle. Also, in being delayed one clock time, the strobe signal is assured of being glitch-free.

The data output interface operates as follows. The interface involves seven signals, the System Timing pulses, the Bid Strobe signal on 64 which indicates that a character is to be transferred to the printer, a Strobe Enable signal which is used to clear register 40, Sampling Strobe signals which sample each character bit from the shift register 40 to the bit buffer 44, the serial output data from buffer 44, and the phase 1 and phase 2 clocks which serve as the fundamental clocks control the operation of the system.

When a character is in the intermediate register is on, a Character Present is generated on 64 to indicate to the receiving side of the interface that a character is to be transferred. The Printer 25 responds to the Character Present signal to change the Strobe Enable to a zero state removing the clear signal from 40. On the system timing pulse following the Character Present signal, the output dynamic shift register 40 is loaded with the bits of the character to be transferred. They then recirculate in this shift register until erased by the Strobe Enable signal returning to the 1 state when transfer of data from buffer 44 to printer 25 is complete. While the character is recirculating in this shift register, the Sampling Strobe signal samples its contents. In this application, the sampling takes place as follows. The output data is to have the format of a serial asynchronous ASCII character. The first bit is therefore a character "start bit". At the beginning of the transfer, the Sampling Strobe signal will occur coincident with the System Timing pulse applying the start bit repeatedly into the output buffer 44. This will continue for the time duration of one character bit. At the time when character bit 1 is to be transmitted, the Sampling Strobe signal will change in time relation to the System Timing pulse. It will now occur one clock time later than the System Timing pulse, causing shift register bit 1 to be sampled into the output buffer. Thus, the time delay between the System Timing pulse and the Sampling Strobe signal determines which data bit will be transferred.

Summarizing therefore, the leading edges of the 7 bit coded signals available from circuit 7 are sensed to detect that they represent a valid character. A valid character is identified by circuit 11 as one which involves a depressed key, and by circuit 12 as not being a multiple key depression. Under these conditions of a valid code, these circuits 11 and 12 immediately remove the enable signal on 14 closing gates 6. This blocks the application of any immediately following character developed as the result of rollover typing for a given time interval. As shown, this interval varies from one to two system timing pulse periods. As shown in FIG. 5 the first system timing pulse X after the initial depression of a first key, causes the corresponding character data to be transferred from the Input Register 7 to the Intermediate Register 15. In FIG. 1, this timing pulse X is applied to Transfer Gates 8 over lead 17 to effect the transfer. In the arrangement of FIG. 1, this timing pulse X is delayed one timing pulse period in 21 before application to OR gate 13 whereupon it will cause an enable signal to once again be developed on lead 14 to open gates 6. Also it will cause circuit 22 to clear or reset Input Register 7 via lead 9 to receive the next data character. This approach prevents the same key depression from effecting multiple typing by the printer. Also this approach precludes the character data associated with a second key depression during rollover typing from being considered for typing until the data associated with the first key depression has been processed for printing. Essentially therefore narrow pulses are generated in response to key depression which pulses are narrower than the time interval between successive system timing pulses which in turn is dimensioned to be less than the 10 millisecond or so interval between successive key depressions as the result of rollover typing. The first timing pulse following the first key depression is employed to transfer character data associated with such key depression to a second register. The second timing pulse is used to clear the first register and to enable gates for receiving the character data associated with the second key depression. The leading edges of the narrow pulses generated in response to key depression are used to establish the coded binary signals representing character data associated with each key depression.

The functioning of the control circuit 22 is now explained in greater detail. OR gate 13 produces a logic 1 signal at phase 2 clock time in response to a logic 1 signal available from no key circuit 11, the multiple key circuit 12, or the character transferred signal available from the gate circuit 6 of FIG. 1. At the same time phase 2 clock time, AND gate 26 produces a logic level 1 output signal in response to a logic level signal 1 available on lead 14 and the occurrence of the timing pulse available on lead 23. The logic 1 signal is inverted in inverter 26 to produce a logic 0 at its output for application to the four transistor signal generator circuit 24 which produces a logic 1 on the reset lead 9 at phase 1 clock time. Generation of the reset pulse during the phase 1 clock time is illustrated in the wave forms of FIG. 2.

With the initially generated character in the intermediate register 15, gates 8 closed, and the input register reset, enable gates 6 then gate the next character to the input register 7 for evaluation. Under these circumstances if the data in 7 is determined to be valid, then the input gates 6 are closed. Because transfer gates 8 are closed, the data in 7 will not interfere with the data previously stored in the intermediate register 15. In response to the storing of data in register 15, a character present signal is developed in the block 16. This can be a flip-flop which is set in response to placing a character in register 15. As will be described shortly, the output of character present block 16 at logic level 1 is to be used to signal the printer 25 that character data is ready to be transferred to the printer from 54 for processing. Under these conditions the data stored in register 15 is made available over lead 34 after processing in the code alteration logic circuit 35 under the control of a special condition input signals available on lead 4. Transfer gates 37 are normally closed in the absence of an enable signal on lead 38 preventing the further application of the character data stored in intermediate register 15, and to the extent modified in logic circuit 35, from being applied to the data bus 30 by means of shift register 40, AND gate 43 and Bit Buffer 44. Gate circuit 37 receives the 7 bit character code from 35 and a start, stop and parity bit in the form of a zero level signal, one level signal and a zero level signal, respectively, from individual voltage sources. It gates these signals in parallel as a 10 bit ASCII code to register 40 and under control of signals from AND gate 50. While transfer gates 37 remain blocked, the data from 15 previously stored in the serial dynamic shift register 40 is circulated in serial bit form as indicated by the feedback line 41. At each Sampling Strobe time established by the signals available on lead 42 from the printer 25, AND gate 43 responds to the particular bit occurring at the output of the shift register during the sampling strobe time to set the state of the Bit Buffer 44 for application over data bus 30 to the printer for processing. The Sampling Strobe signal available on lead 42 and associated with the ten bit times of the character circulating in register 40 controls the transfer of the data.

FIG. 2 illustrates graphically the relative timing of the phase 1 and phase 2 clocks developed by the printer 25 on leads 39 and 49 and the system timing pulses developed on lead 36. There is also shown an example of a reset signal or pulse being developed on lead 9 during the phase 1 portion of a system timing pulse dependent on a signal being developed on lead 14 indicating that an invalid character has been detected at the output of Input Register 7 or that a valid character has been transferred from Register 7 to the Intermediate Register 15.

Figure 3:
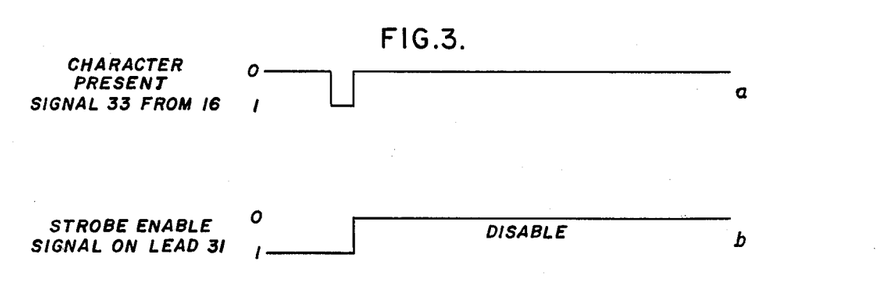

FIG. 3 illustrates graphically a Character Present signal developed by 16 (FIG. 3a) and the relationship thereto of a Strobe Enable signal developed on 31.

Figure 4:
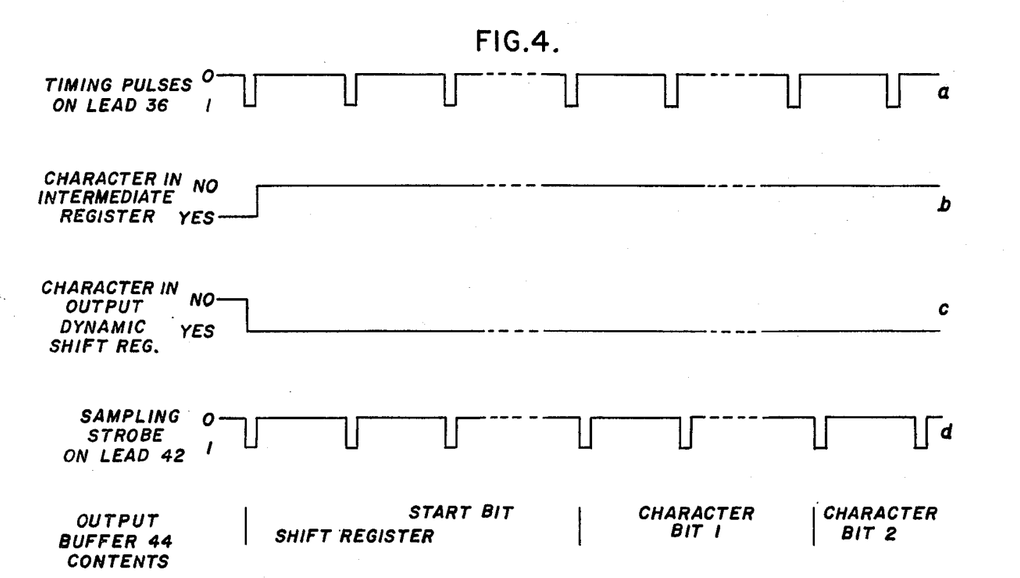

FIG. 4 illustrates graphically how the character data is sampled out of shift register 40 into the Bit Buffer 44 for application to the printer 25 to effect printing of characters and the execution of control functions associated therewith.

FIG. 5 illustrates graphically the relative timing of the system timing pulses developed by the printer 25 and the response of the Input Gates 6, the Input and Intermediate Registers 7 and 15 and Shift Register 40 to an output signal developed by the multiple key array 1. In a particular embodiment the timing pulses were of 10 microsecond duration and occurred at a periodic rate of 10,000 pulses per second.

FIG. 4 also shows the time relationship between the sampling strobe pulses available on lead 42 and the system timing pulses available on lead 36 for different character bit times. When the printer 25 accepts the last bit associated with the character last circulating in the shift register 40, a strobe enable logic level 1 signal is developed by the printer 25 on lead 31. For the time being, let us assume that there is also a logic level 1 signal developed on lead 45. Under these circumstances a logic level 1 signal in 16 indicates a character present in register 15. This logic level 1 signal signals the printer that there is a further character in the intermediate storage register 15 ready to be transferred to the printer. Logic level 1 signal on lead 46 is stored in flip-flop 48 until the next timing pulse is available on lead 36. AND gate 50 responds to the output of the flip-flop 48 and the timing pulse on 36 to apply an enabling signal over lead 38 to the transfer gate 37 to transfer the data stored in 15 as modified by 35 in parallel form to the parallel to serial dynamic shift register 40 where it is circulated in serial bit form as previously explained. Sampling Strobe signals available on lead 42 now apply the respective bits of the character circulating in register 40 through the bit buffer 44 to the data bus 30 for utilization by printer 25. The application of the data stored in 40 to printer 25 continues as previously explained until the Sampling Strobe associated with the tenth character bit occurs whereupon the output register is erased by the Strobe Enable signal on lead 31. The transfer gate 37 was opened only sufficiently long to enable the data to be transferred from the intermediate register to the shift register 40. The register 40 must await the next opening of gates 37 under control signals on lead 38 before making the next character data available to the printer.

What I claim and desire to secure by Letters Patent of the United States:

1. In a printer for executing functions represented by signals, a source of recurrent system timing pulses, a plurality of symbol keys on a keyboard, first, second and third signal storage registers,
    means for manually depressing said keys to produce respective key pulses of substantially brief duration which are independent of the duration of time that any particulaar key remains depressed,
    means for converting said key pulses to respective binary coded signals representing the symbol associated with the operated key,
    first gates for applying said converted binary coded signals to a first register,
    means for analyzing the binary coded signals in said first register to detect signals representing the absence of a no key or the absence of a multiple key depression,
    means responsive to said detected signals to block said first gates until two system timing pulses have occurred following a key depression,
    second gates responsive to the first timing pulse occurring after key depression and to the second register being empty of signals for transferring binary coded signals from said first to said second register,
    means responsive to the second timing pulse following key depression for clearing the first register and unblocking said first gates,
    means responsive to said second register having signals stored therein and said second timing pulse for transferring binary coded signals from the second to the third register and clearing the second register after said last named transfer,
    means for converting the signals in said third register from parallel to serial form,
    means for transferring said third register signals in serial form to said printer for execution of the represented functions by said printer,
    means responsive to transfer of said third register signals to said printer for clearing said third register,
    means for analyzing the signals in said first register to detect signals representing a no key or a multiple key operation,
    and means responsive to said last named detected signals to unblock said first gates.

2. An arrangement according to claim 1 wherein said key pulses are of substantially shorter duration than the time between two successive rollover key depressions by an operator.

3. An arrangement according to claim 1 wherein the duration of said key pulses is substantially less than 10 milliseconds.

4. An arrangement according to claim 3 wherein the duration and pulse recurrence rate of said timing pulses is of the order of 10 microseconds and 10,000 pulses per second respectively.

5. In combination, a source of recurrent timing signals, a plurality of symbol keys on a keyboard, first, second and third signal storage registers, a signal execution device,
    means for operating said keys to produce respective key pulses of substantially brief duration which are independent of the duration of time that any particular key is operated,
    means for converting said key pulses to digital signals representing the symbol associated with the operated key,
    first gates for applying said digital signals to said first register,
    means for analyzing the digital signals in said first register to detect signals representing the absence of a no key or the absence of a multiple key operation,
    means responsive to said last named detected signals to block said first gates until two system timing pulses have occurred following a key depression,
    second gates responsive to the first timing pulse occurring after key depression and to the second register being empty of signals for transferring digital signals from said first to said second register,
    means responsive to the second register having stored signals for producing a control signal,
    means responsive to the second timing pulse following key operation for clearing said first register and unblocking said first gates,
    means responsive to said control signal and said second timing pulse for transferring digital signals from the second to the third register and clearing the second register after said last named transfer,
    means for converting the signals in said third register from parallel to serial form,
    means for transferring said third register signals in serial form to said device for execution by said device,
    means responsive to transfer of said third register signals to said printer for clearing said third register, means for analyzing the signals in said first register for detecting signals representing a no key or a multiple key operation, and means responsive to said last named detected signals to unblock said first gates and clear said first register of signals.

6. An arrangement according to claim 5 wherein said key pulses are of substantially shorter duration than the time between two successive rollover key operations by an operator.

7. In combination, a source of recurrent timing signals, a plurality of symbol keys on a keyboard, first and second registers, means for operating said keys to produce respective key pulses of substantially brief duration which are independent of the duration of time that any particular key is operated, means for converting said key pulses to digital signals representing the symbol associated with the operated key, first gates for applying said digital signals to said first register, means for analyzing the digital signals in said first register to detect signals representing the absence of a no key or the absence of a multiple key operation, means responsive to said last named detected signals to block said first gates until two system timing pulses have occurred following a key depression, second gates responsive to the first timing pulse occurring after key operation and to the second register being empty of signals for transferring binary coded signals from said first to said second register, and means responsive to the second timing pulse following key operation for clearing said first register, unblocking said first gates, transferring digital signals out of the second register and clearing the second register after said last named transfer.

8. An arrangement according to claim 7 comprising means for analyzing the signals in said first register for detecting a no key or a multiple key operation, and means responsive to said last named detected signals to unblock said first gates.

9. An arrangement according to claim 7 wherein said key pulses are of substantially shorter duration than the time between two successive rollover key operations by an operator.

10. A signal processing arrangement comprising a plurality of symbol keys on a keyboard, means for operating said keys to establish a unique binary coded signal representative of the symbol associated with each of said operated keys, means responsive to any one key being operated for translating the established binary coded signals associated with said one key, means responsive to a plurality of keys being operated simultaneously to inhibit translation of any established binary coded signals associated with any of said operated keys, means responsive to substantially the initial instant of a second key being operated within a given predetermined time period after the initial instant of operation of a first key to inhibit translation of any established binary coded signal associated only with said operated second key, and means responsive to substantially the initial instant of a second key being operated after said given predetermined time period of operation of said first operated key to translate the binary coded signals associated with said operated first and second keys.

11. In combination, a source of recurrent system timing pulses, a plurality of symbol keys on a keyboard, first, second and third signal storage registers, a signal execution device, means for manually operating said keys to produce respective key pulses of substantially brief duration representing the initial operation of a key and which are independent of the duration of time that such key remains operated, means for converting said key pulses to respective binary coded signals representing the symbol associated with the operated key, first gates for applying said converted binary coded signals to a first register, means for analyzing the binary coded signals in said first register to detect signals representing the absence of a no key or the absence of a multiple key operation, means responsive to said detected signals to block said first gates, second gates responsive to the first timing pulse occurring after key operation and to the second register being empty to signals for transferring binary coded signals from said first to said second register, means responsive to the occurrence of a given plurality of timing pulses following key operation for clearing the first register and unblocking said first gates, means responsive to said occurrence of timing pulses and said second register having signals stored therein for transferring binary coded signals from the second register to said third register for execution, and clearing the second register after said last named transfer, means for converting the signals in said third register from parallel to serial form, means for transferring third register signals in serial form to said device for execution by said device, means responsive to transfer of said third register signals to said device for clearing said third register, means for analyzing the signals in said first register to detect a signal representing a no key or a multiple key operation, and means responsive to said last named detected signal to unblock said first gates.

12. An arrangement according to claim 11 wherein said key pulses are of substantially shorter duration than the time between two successive rollover key operations by an operator.

13. An arrangement according to claim 11 wherein the duration of said key pulses is substantially less than 10 milliseconds.

14. An arrangement according to claim 13 wherein the duration and pulse recurrence rate of said timing pulses is of the order of 10 microseconds and 10,000 pulses per second respectively.

15. In combination, a source of recurrent timing signals, a plurality of symbol keys on a keyboard, first and second signal storage devices, means for operating said keys to produce respective key pulses which are independent of the duration of time that any particular key is operated and which are of shorter duration than the time between a given plurality of successive timing signals, means for converting said key pulses to digital signals representing the symbol associated with the operated key, first means for applying said digital signals serially to said first storage device, means for analyzing the digital signals in said first storage device to detect valid signals representing the absence of a no key and the absence of a multiple key operation, second means responsive to a timing signal occurring after key operation and to the second device being empty to signals for transferring valid binary coded signals from said first to said second storage device, and means responsive to said timing pulse and said second storage device having signals stored therein for transferring digital signals out of the second device.

16. An arrangement according to claim 15 comprising means for analyzing the signals in said first storage device for detecting an invalid signal representing a no key or a multiple key operation, and means responsive to said last named detected signal for rejecting said invalid signal.

17. An arrangement according to claim 15 wherein said key pulses are of substantially shorter duration than the time between two successive rollover key operations by an operator.

18. A signal processing arrangement comprising a source of recurrent timing signals, a plurality of symbol keys on a keyboard, means for operating said keys, means responsive to the initial instant of operation of each key to establish a unique binary coded signal representative of the symbol associated with such key, means responsive to substantially the initial instant of a second key being operated before a plurality of timing signals have occurred after operation of a first key to inhibit translation of any established binary coded signal associated only with said operated second key, and means responsive to substantially the initial instant of a second key being operated after said last named plurality of timing signals have occurred to translate the binary coded signals associated with said operated first and second keys.

19. An arrangement according to claim 18 wherein said plurality of timing signals is two signals.

* * * * *